(12) United States Patent
Zhou et al.

(10) Patent No.: US 12,174,518 B2
(45) Date of Patent: Dec. 24, 2024

(54) RADIATOR AND PHOTOGRAPHIC LIGHT

(71) Applicant: Aputure Imaging Industries Co., Ltd., Guangdong (CN)

(72) Inventors: Binbin Zhou, Guangdong (CN); Chunghao Lai, Guangdong (CN); Tao Yuan, Guangdong (CN); Yingming Li, Guangdong (CN)

(73) Assignee: APUTURE IMAGING INDUSTRIES CO., LTD., Guangdong (CN)

( * ) Notice: Subject to any disclaimer, the term of this patent is extended or adjusted under 35 U.S.C. 154(b) by 0 days.

(21) Appl. No.: 18/398,887

(22) Filed: Dec. 28, 2023

(65) Prior Publication Data

US 2024/0219818 A1 Jul. 4, 2024

(30) Foreign Application Priority Data

Dec. 29, 2022 (CN) .......................... 202223602737.X

(51) Int. Cl.
  *G03B 17/55* (2021.01)
  *G03B 15/02* (2021.01)
  *H05K 7/20* (2006.01)

(52) U.S. Cl.
  CPC ............ *G03B 17/55* (2013.01); *G03B 15/02* (2013.01); *H05K 7/20145* (2013.01); *H05K 7/20263* (2013.01); *H05K 7/20272* (2013.01)

(58) Field of Classification Search
  CPC .... G03B 17/55; G03B 15/02; H05K 7/20145; H05K 7/20263; H05K 7/20272; H05K 7/20136; H05K 7/20172; H05K 7/20218; F21V 29/503; F21V 29/51; F21V 29/56; F21V 29/59; F21V 29/67
  See application file for complete search history.

(56) References Cited

U.S. PATENT DOCUMENTS 11,175,029 B1 * 11/2021 Zhang ...................... F21V 29/51
11,473,758 B1 * 10/2022 Peng ...................... G03B 15/06

* cited by examiner

*Primary Examiner* — Bao Q Truong
(74) *Attorney, Agent, or Firm* — CANTOR COLBURN LLP

(57) ABSTRACT

A radiator and a photographic light. The radiator includes a coolant tank, a support frame, a heat-absorbing assembly and a driving pump. The coolant tank has a heat exchange pipe for a coolant to circulate, and the heat exchange pipe has a first liquid inlet and a first liquid outlet; the support frame is arranged around the coolant tank, the support frame and the coolant tank enclose a heat exchange space for exchanging heat with the heat exchange pipe; the heat-absorbing assembly has a heat dissipation channel, and the heat dissipation channel has a second liquid inlet and a second liquid outlet; the driving pump is configured to drive the coolant to circulate along the heat exchange pipe, the first liquid outlet, the second liquid inlet, the heat dissipation channel, the second liquid outlet and the first liquid inlet in sequence.

20 Claims, 9 Drawing Sheets

RADIATOR AND PHOTOGRAPHIC LIGHT

CROSS-REFERENCE TO RELATED APPLICATIONS

The present application claims the benefit of Chinese patent application No. 202223602737.X filed on Dec. 29, 2022, titled "Radiator and Photographic Light", the entire contents of which are incorporated herein by reference.

TECHNICAL FIELD

The present application relates to the field of heat dissipation technology, and in particular, to a radiator and a photographic light.

BACKGROUND

In the field of photographic lighting, the light source is the largest heat source of the entire photographic light. The light source of most photographic lights is a light-emitting diode (LED) light source, with the characteristics of small size and high heat generation, which is conducive to the miniaturization of photographic lights. Photographic lights are equipped with radiators to dissipate heat from the light source. The radiator has various parts, and it is time-consuming to assemble the radiator on-site. Moreover, the installed radiator is usually large in size and occupies a large space, which is not conducive to the miniaturization of photographic lights.

SUMMARY

The present application is to provide a radiator and a photographic light, aiming to solve the technical problems of the existing radiator being large and occupying a large space after being installed on site.

In a first aspect, the present application provides a radiator, including:
- a coolant tank, the coolant tank has a heat exchange pipe for a coolant to circulate, and the heat exchange pipe has a first liquid inlet and a first liquid outlet;
- a support frame installed on the coolant tank, one end of the support frame is higher than the coolant tank, the support frame is arranged around the coolant tank, the support frame and the coolant tank enclose a heat exchange space for exchanging heat with the heat exchange pipe;
- a heat-absorbing assembly located outside the heat exchange space, the heat-absorbing assembly has a heat dissipation channel, and the heat dissipation channel has a second liquid inlet connected to the first liquid outlet and a second liquid outlet connected to the first liquid inlet; and
- a driving pump installed on the support frame and located outside the heat exchange space, the driving pump is configured to drive the coolant to circulate along the heat exchange pipe, the first liquid outlet, the second liquid inlet, the heat dissipation channel, the second liquid outlet and the first liquid inlet in sequence.

In one embodiment, the radiator further includes a fan, and the fan is installed in the heat exchange space.

In one embodiment, the radiator further includes an air guide, and the air guide is disposed on a side of the coolant tank away from the fan.

In one embodiment, the first liquid inlet, the first liquid outlet, the second liquid inlet, the second liquid outlet and the driving pump are connected through pipe fittings according to the flow direction of the coolant, and the pipe fittings extend along a surface of the support frame.

In one embodiment, the support frame includes two support plates, the two support plates are spaced apart along a first direction on opposite sides of the coolant tank, and each support plate includes a mounting part and supporting parts, the mounting part is fixed to a side wall of the coolant tank, the number of the supporting parts is two or more, and the two or more supporting parts are connected to a bottom part of the mounting part at intervals.

In one embodiment, the support frame further includes a first frame extending along the first direction, the first frame is located on one side of the coolant tank, and two ends of the first frame are respectively connected to the supporting parts of the two support plates, and a side of the first frame away from the heat exchange space is configured to install the heat-absorbing assembly.

In one embodiment, the support frame further includes a second frame, and the first frame and the second frame are spaced apart along a second direction on opposite sides of the coolant tank, the second direction is perpendicular to the first direction, two ends of the second frame are respectively connected to the supporting parts of the two support plates, and a side of the second frame away from the heat exchange space is configured to install the driving pump.

In one embodiment, the support frame further includes an annular frame, the annular frame is arranged around a bottom part of the heat exchange space, and the annular frame is fixed to a bottom part of the supporting parts.

In one embodiment, the annular frame has a connection hole for connecting with a case of the photographic light.

In one embodiment, the support frame further includes reinforcing bars, and the reinforcing bars are respectively connected to all the supporting parts of the same support plate.

In one embodiment, the heat-absorbing assembly includes:
- a mounting member having the second liquid inlet and the second liquid outlet disposed opposite to each other, where a first groove, a second groove and a third groove are provided on a side surface of the mounting member, one end of the first groove is connected to the second liquid inlet, the other end of the first groove extends in a direction toward the second liquid outlet and is a closed end, and the second groove is spaced apart from the first groove, the second groove extends in a direction from the second liquid inlet to the second liquid outlet, and an end of the second groove close to the second liquid inlet is a closed end, and the other end of the second groove close to the second liquid outlet is communicated with the second liquid outlet through the third groove; and
- a heat-absorbing plate, where the heat-absorbing plate is hermetically installed on the mounting member and covers the first groove, the second groove and the third groove, and one side of the heat-absorbing plate facing the mounting member is provided with a plurality of heat sink slits spaced apart along the direction from the second liquid inlet to the second liquid outlet, and the heat sink slits communicate with the first groove and the second groove, the heat sink slits, the first groove, the second groove and the third groove together form the heat dissipation channel.

In one embodiment, the radiator further includes a driving box, the driving box is installed on the support frame, and the driving box is electrically connected to the driving pump to control the driving pump to initiate and stop.

In one embodiment, the driving box (420) and the driving pump (410) are located on the same side of the heat exchange space (201).

In one embodiment, the driving box (420) and the heat-absorbing assembly (300) are located on opposite sides of the heat exchange space (201).

In a second aspect, the present application provides a photographic light, which includes a light source and the radiator described in any one of the above embodiments, the light source is installed on the support frame or the heat-absorbing assembly, and the light source is in contact with the heat-absorbing assembly.

The advantageous effects of the radiator and photographic light provided by the application are: the heat source that needs to be dissipated is in contact with the heat-absorbing assembly, and the coolant circulates along the heat exchange pipe, the first liquid outlet, the second liquid inlet, the heat dissipation channel, the second liquid outlet and the first liquid inlet in sequence, exchanging heat with the heat source in the heat dissipation channel to achieve heat dissipation and cooling of the heat source, and exchanging heat with the heat exchange space in the heat exchange pipe to reduce the temperature of itself. The support frame surrounds the coolant tank, and the heat-absorbing assembly and driving pump are both installed on the support frame, which allows a good integrity and can be produced, transported and installed as a unity. Each component is compactly arranged around the coolant tank, which does not occupy the internal space of the heat exchange space and avoids a large dimension in a single direction. This solves the technical problems of large dimensions and space occupation of the existing radiators after on-site installation, allowing the radiator and the photographic light using the radiator to be miniaturized.

BRIEF DESCRIPTION OF THE DRAWINGS

In order to more clearly illustrate the technical proposals in embodiments of the present application, accompanying drawings that are used in the description of the embodiments or exemplary existing technologies are briefly introduced hereinbelow. Apparently, the drawings in the following description are merely some embodiments of the present application. For those skilled in the art, other drawings can also be obtained according to these drawings without any creative effort.

Figure 1:
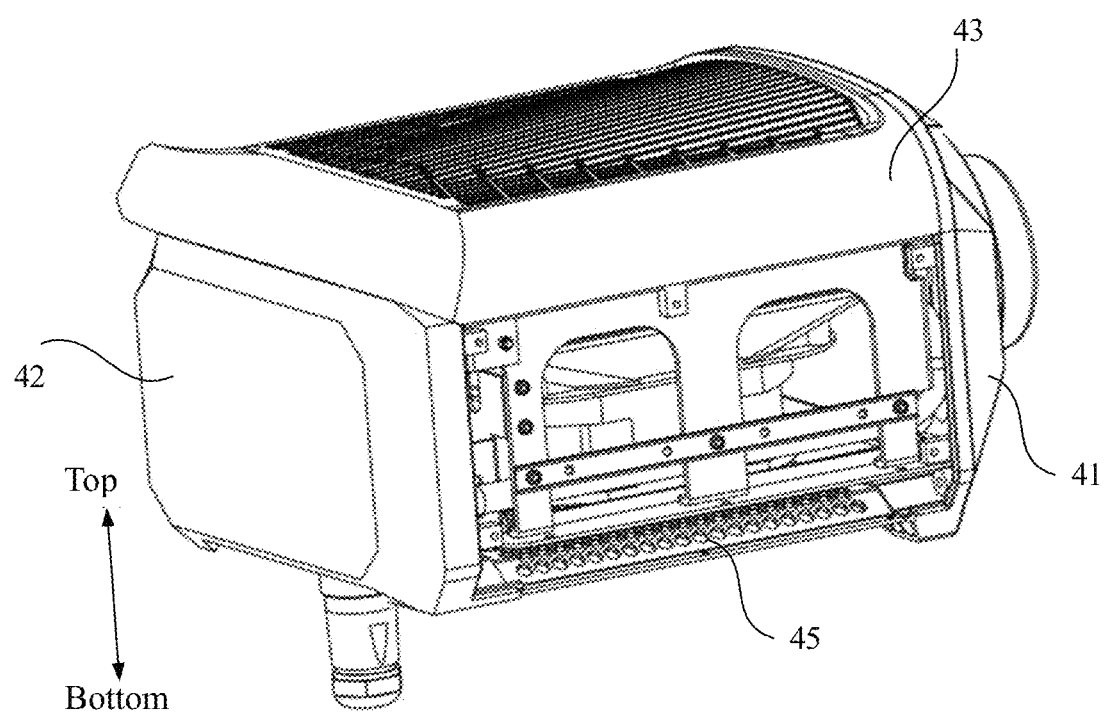
FIG. 1 is a schematic structural diagram of a photographic light provided by an embodiment of the present application.

The reference signs are as follows.

X first direction; Y second direction;
10 radiator; 20 light source; 30 air guide; 41 front case; 42 rear case; 43 top case; 45 dust-proof mesh;
100 coolant tank; 110 heat exchange pipe; 111 first liquid inlet; 112 first liquid outlet; 113 flat tube; 130 tank case; 140 first heat sink fin; 150 insertion plate; 160 sealing cover;
200 support frame; 201 heat exchange space; 210 support plate; 211 mounting part; 212 supporting part; 213 first bent part; 220 first frame; 230 second frame; 231 second bent part; 240 annular frame; 241 connection hole; 250 reinforcing bar;
300 heat-absorbing assembly; 310 mounting member; 311 second liquid inlet; 312 second liquid outlet; 313 first groove; 314 second groove; 315 third groove; 316 mounting groove; 317 positioning recess; 318 mounting hole; 320 heat-absorbing plate; 321 plate body; 322 second heat sink fin; 323 heat sink slit;
410 driving pump; 420 driving box; 430 fan;
510 first pipe fitting; 520 second pipe fitting; and 530 third pipe fitting.

DETAILED DESCRIPTION OF THE EMBODIMENTS

The embodiments of the present application are described in detail below. Examples of the embodiments are shown in the drawings, in which the same or similar reference signs throughout represent the same or similar elements or elements with the same or similar functions. The embodiments described below with reference to the drawings are exemplary and intended to explain the present application, but should not be understood as limiting the present application.

Reference throughout this specification to "one embodiment" or "an embodiment" means that a particular feature, structure or characteristic described in connection with the embodiment is included in at least one embodiment of the present application. Thus, the phrases "in one embodiment" or "in some embodiments" appear in various places throughout the specification, and not all refer to the same embodiment. Furthermore, the particular features, structures, or characteristics may be combined in any suitable manner in one or more embodiments.

In the description of the present application, it should be understood that the orientations or positional relationships indicated by the terms "length", "width", "upper", "lower", "front", "rear", "left", "right", "vertical", "horizontal", "top", "bottom", "inner", "outer", etc. are based on the orientations or positional relationships shown in the drawings, and are only for the convenience of describing the present application and simplifying the description, and are not intended to indicate or imply that the device or element referred to must have a specific orientation, be constructed and operated in a specific orientation, and therefore cannot be construed as a limitation on the present application.

In addition, the terms "first" and "second" are used for descriptive purposes only and cannot be understood as indicating or implying relative importance or implicitly indicating the quantity of indicated technical features. Therefore, features defined as "first" and "second" may explicitly or implicitly include one or more of these features.

In this application, unless otherwise expressly stipulated and defined, the terms "installed", "connected", "connection", "fixed" and the like should be construed in a broad sense. For example, it may be fixedly connected or detachably connected, or integrated; it may be a mechanical connection or an electrical connection; it may be a direct connection or an indirect connection through an intermediate medium; it may be an internal communication between two elements or an interaction between two elements. For those of ordinary skill in the art, the specific meanings of the above terms in the present application can be understood according to specific circumstances.

The radiator 10 and the photographic light in an embodiment of the present application will be described below.

Figure 2:
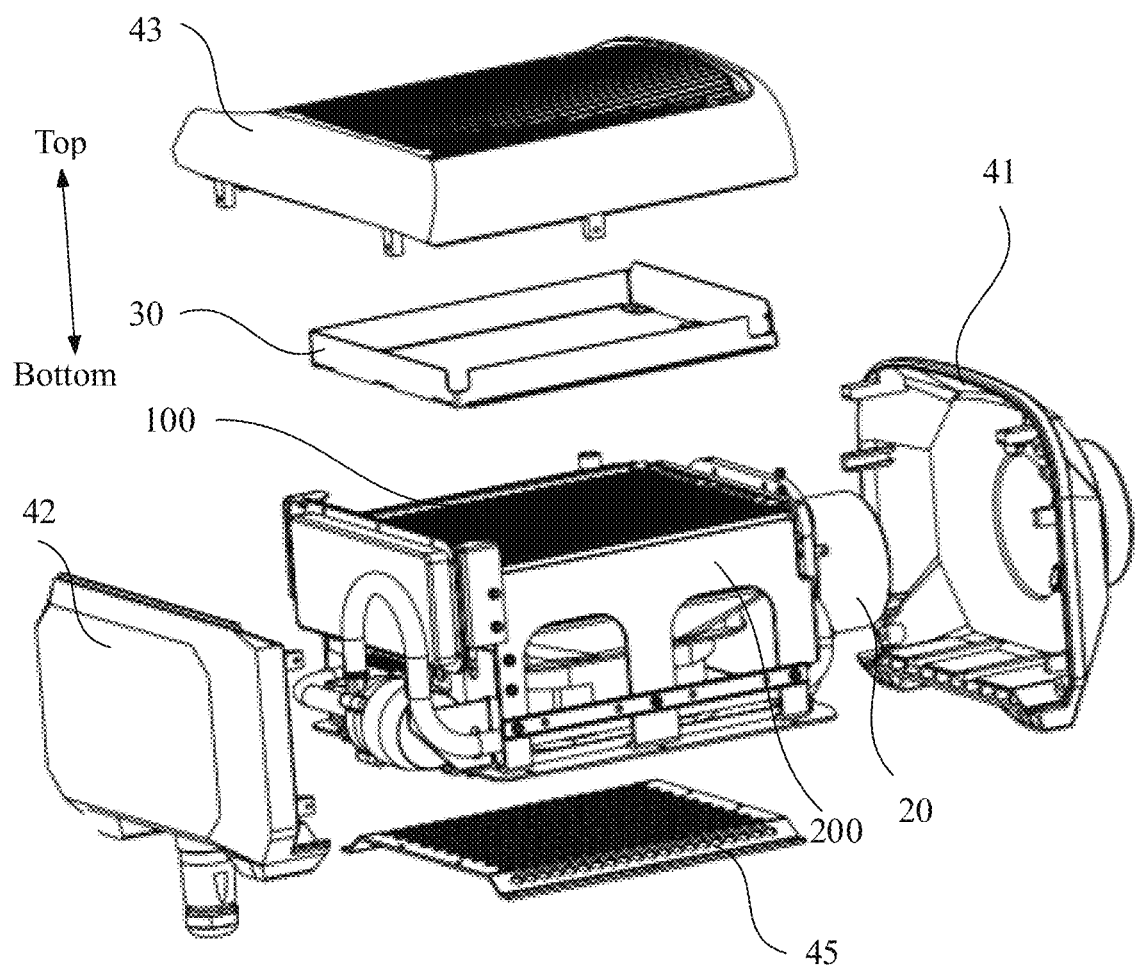
FIG. 2 is an exploded view of the photographic light in FIG. 1.

FIG. 1 is a schematic structural diagram of a photographic light provided by an embodiment of the present application. FIG. 2 is an exploded view of the photographic light of FIG. 1. The photographic light includes a light source 20 and a radiator 10. The radiator 10 is configured to dissipate and cool down the light source 20 to prevent the light source 20 from malfunctioning due to excessive temperature.

Specifically, the light source 20 is mounted on the radiator 10. The light source 20 and the radiator 10 may be in direct contact to achieve heat conduction for dissipating heat.

Optionally, the photographic light includes a case to protect the radiator 10 and the light source 20. The case specifically includes a front case 41, a rear case 42, a top case 43 and a dust-proof mesh 45. The front case 41 is installed on the front of the radiator 10, covering the light source 20, and has a hole for light to pass through to avoid affecting the light source 20. The rear case 42 is installed at the rear of the radiator 10, and the top case 43 is provided with heat dissipation holes in the area facing the radiator 10 to facilitate heat dissipation at the bottom of the radiator 10. The dust-proof mesh 45 is installed at the bottom of the radiator 10 and does not affect the heat dissipation at the bottom of the radiator 10.

Figure 3:
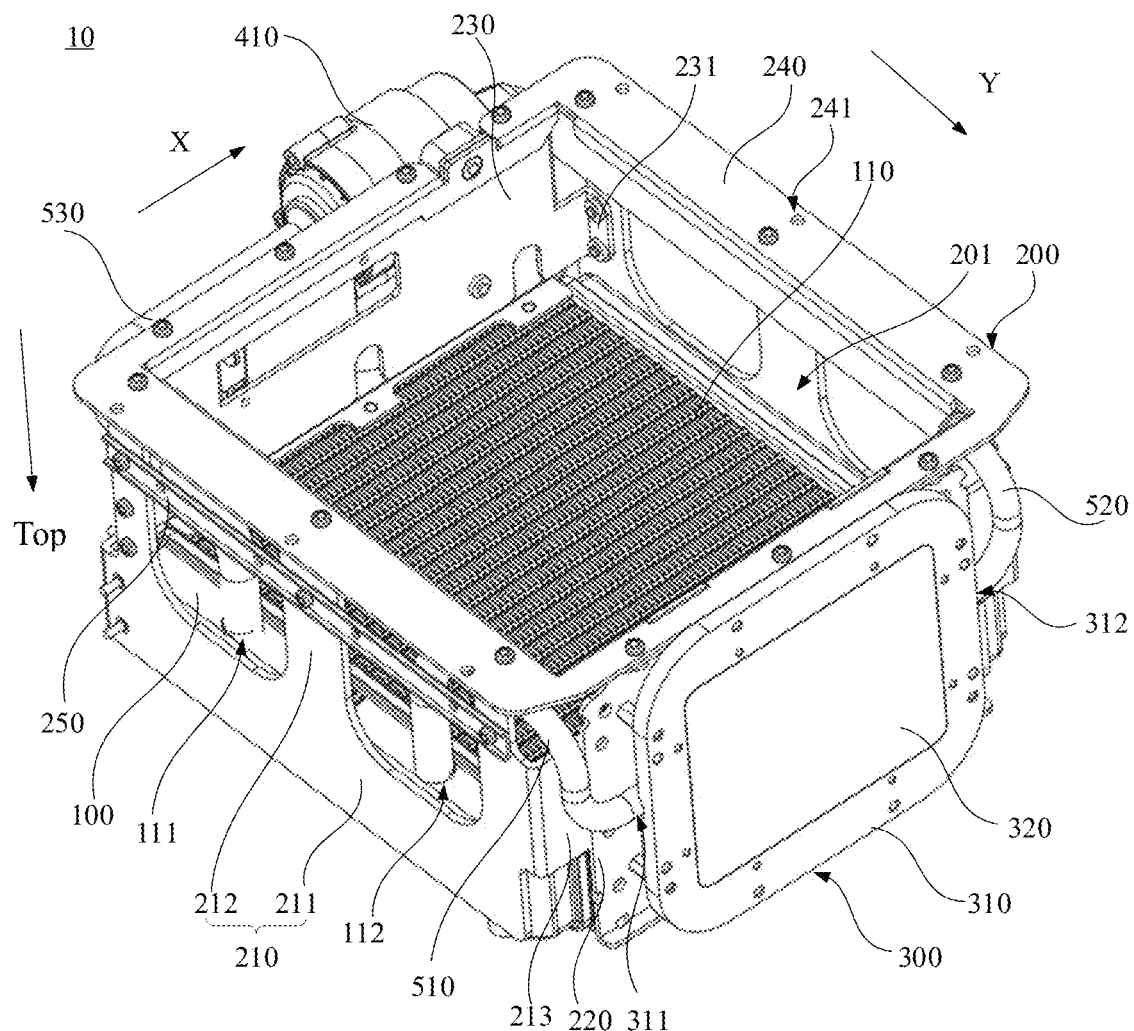
FIG. 3 is a schematic structural diagram of the radiator provided in this embodiment.
Figure 4:
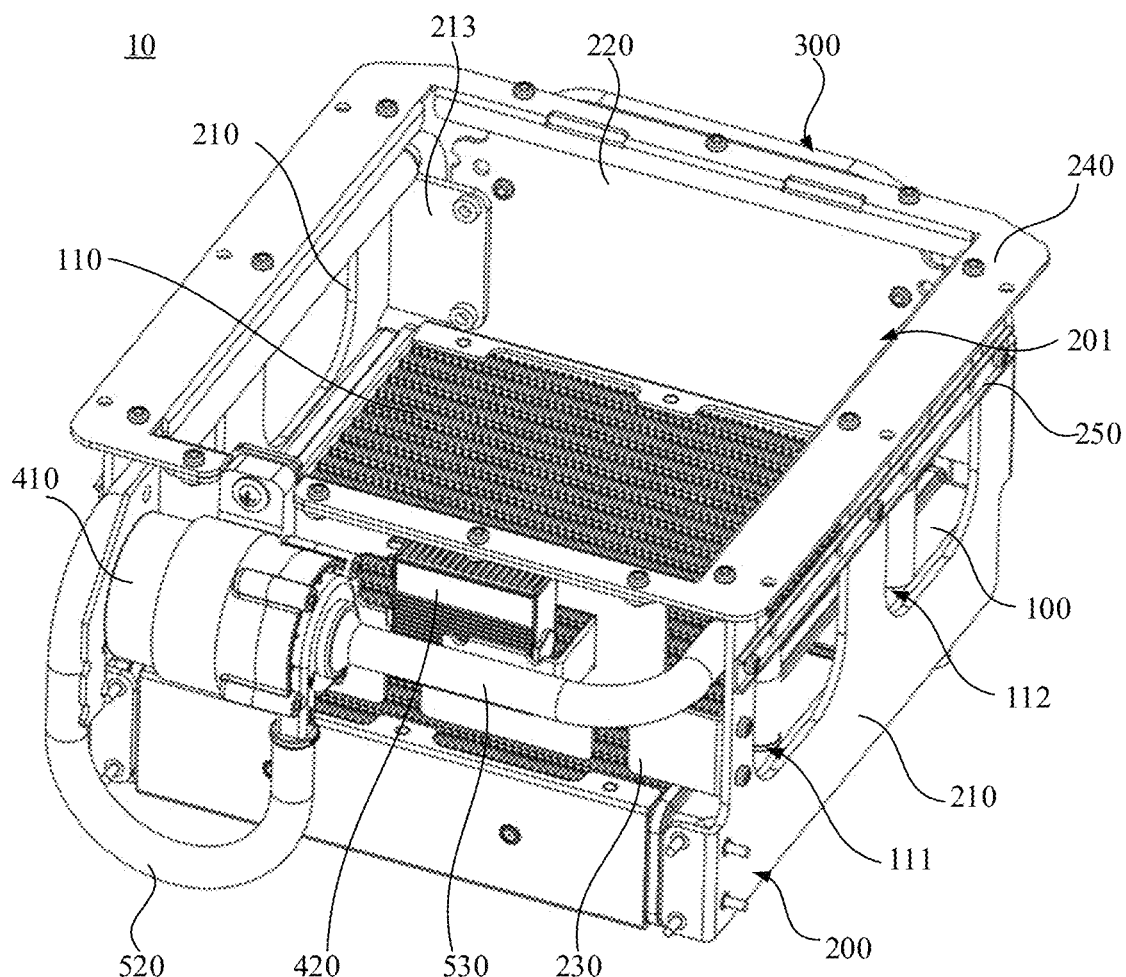
FIG. 4 is another perspective view of the radiator in FIG. 3.

FIG. 3 is a schematic structural diagram of the radiator 10 provided in this embodiment. FIG. 4 is another perspective view of the radiator 10 in FIG. 3. The radiator 10 provided in this embodiment includes a coolant tank 100, a support frame 200, a heat-absorbing assembly 300 and a driving pump 410.

The coolant tank 100 has a heat exchange pipe 110 for circulating coolant. The heat exchange pipe 110 has a first liquid inlet 111 and a first liquid outlet 112. The support frame 200 is installed on the coolant tank 100. One end of the support frame 200 is higher than the coolant tank 100. The support frame 200 is arranged surrounding the coolant tank 100. The support frame 200 and the coolant tank 100 enclose a heat exchange space 201 for heat exchange with the heat exchange pipe 110. The lower part of the heat exchange space 201 is open and can exchange heat with the air, thereby reducing the temperature of the coolant in the heat exchange pipe 110.

Figure 5:
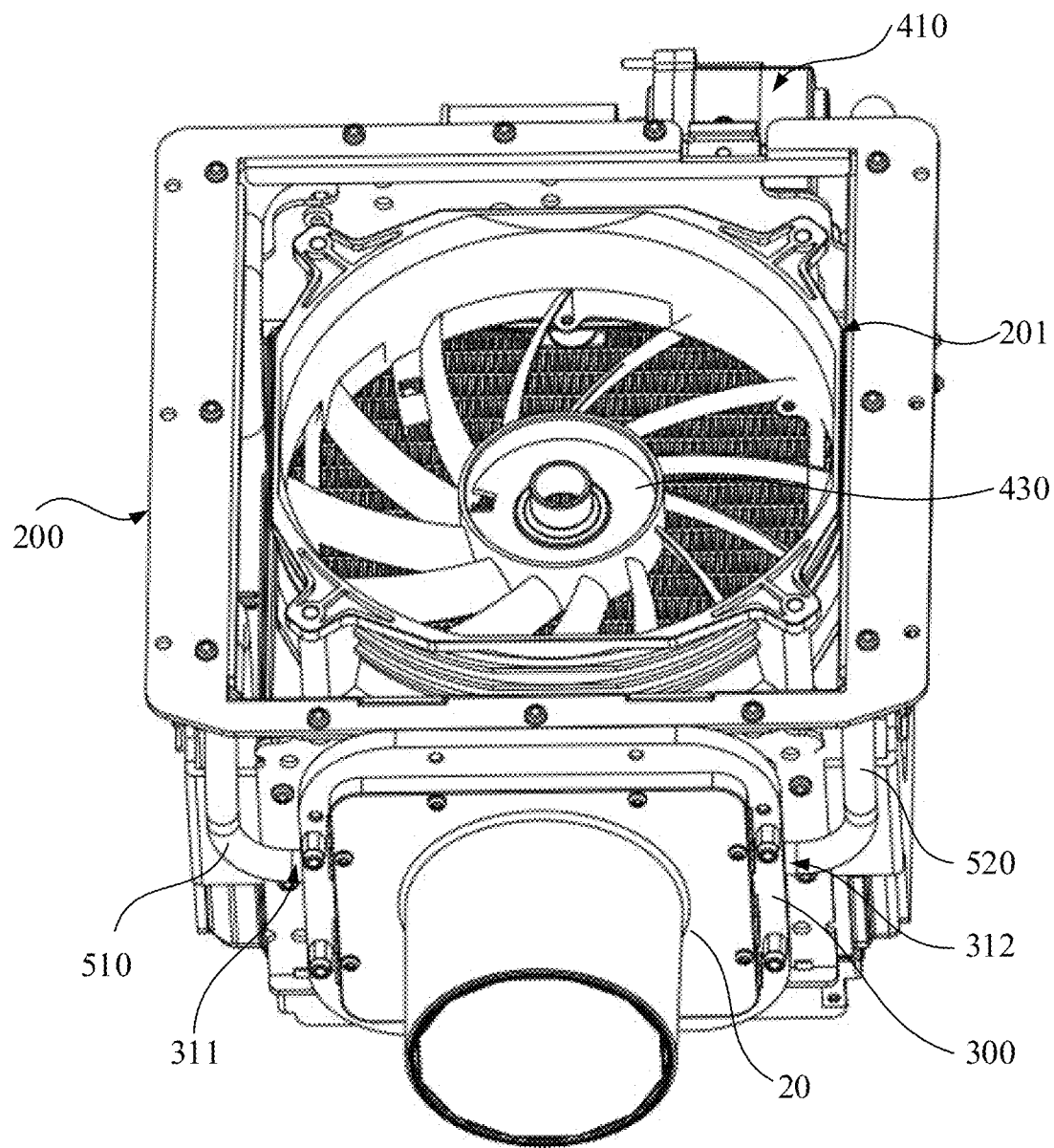
FIG. 5 is another structural schematic diagram of the radiator provided in this embodiment.

In some embodiments, further referring to FIG. 5, a fan 430 is installed in the heat exchange space 201. The fan 430 promotes the flow of air, which can increase the heat dissipation efficiency of the heat exchange pipe 110. Specifically, the radiator 10 also includes an air guide 30. The air guide 30 is disposed on a side of the coolant tank 100 away from the fan 430. That is, the air guide 30 and the fan 430 are located on opposite sides of the coolant tank 100 so that the airflow passes through the fan 430, the coolant tank 100 and the air guide 30 in sequence.

The heat-absorbing assembly 300 is located outside the heat exchange space 201. The heat-absorbing assembly 300 has a heat dissipation channel. The heat dissipation channel has a second liquid inlet 311 connected with the first liquid outlet 112 and a second liquid outlet 312 connected with the first liquid inlet 111. The driving pump 410 is installed on the support frame 200 and located outside the heat exchange space 201. The driving pump 410 is configured to drive the coolant to circulate along the heat exchange pipe 110, the first liquid outlet 112, the second liquid inlet 311, the heat dissipation channel, the second liquid outlet 312 and the first liquid inlet 111 in sequence.

Optionally, the heat-absorbing assembly 300 is installed on the support frame 200 or the heat exchange pipe 110.

When the radiator 10 is used in a photographic light, the light source 20 is installed on the support frame 200 or the heat-absorbing assembly 300, and the light source 20 is in contact with the heat-absorbing assembly 300. The coolant circulates along the heat exchange pipe 110, the first liquid outlet 112, the second liquid inlet 311, the heat dissipation channel, the second liquid outlet 312 and the first liquid inlet 111 circulate in sequence and exchanges heat with the light source 20 in the heat dissipation channel to achieve heat dissipation and cooling of the light source 20. In the heat exchange pipe 110 the coolant exchanges heat with the heat exchange space 201 to reduce its own temperature. The support frame 200 is arranged around the coolant tank 100. The heat-absorbing assembly 300 and the driving pump 410 are both installed on the support frame 200, so that the radiator has a good integrity and can be produced, transported and installed as a whole. Each component is arranged compactly around the coolant tank 100, without occupying the internal space of the heat exchange space 201, and avoids excessive size in a single direction, so that the radiator 10 and the photographic light using the radiator 10 can be miniaturized.

It can be understood that in other embodiments, the radiator 10 may also be applied to dissipate heat from other heat sources.

Figure 6:
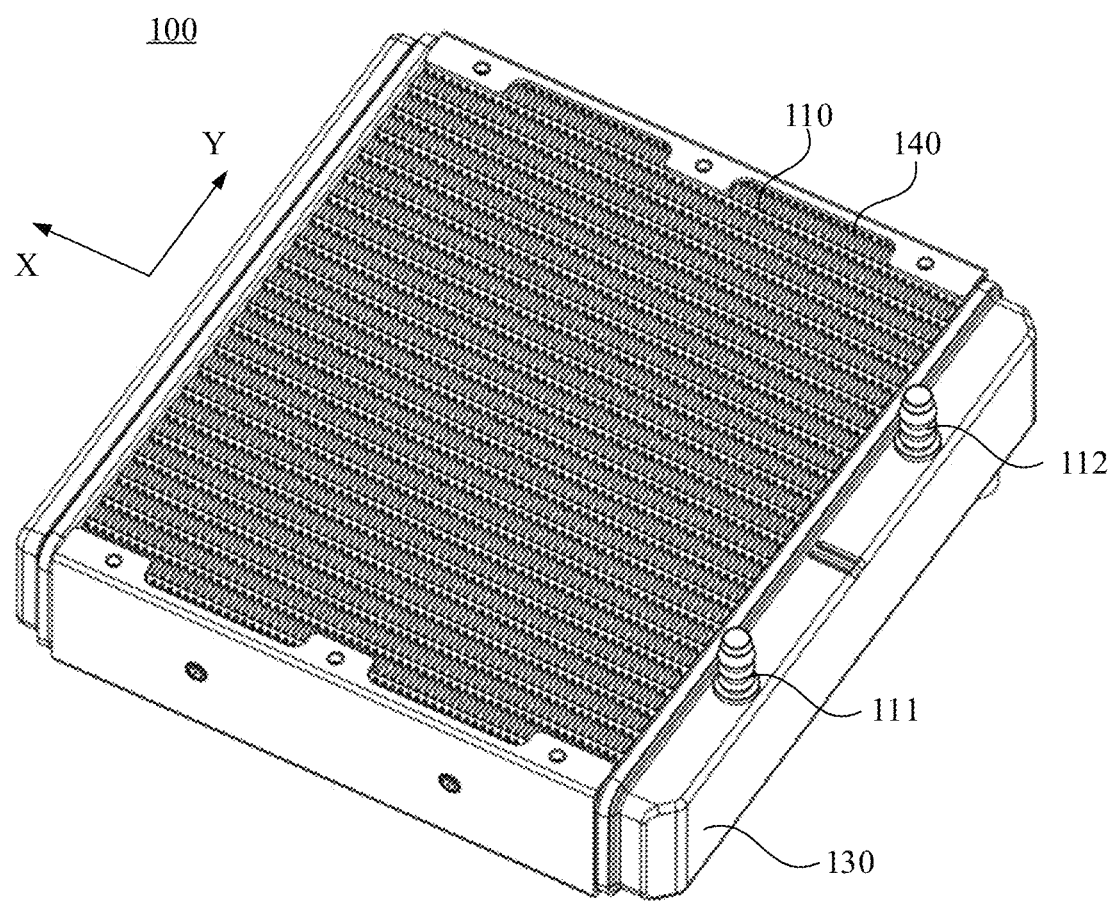
FIG. 6 is a schematic structural diagram of the coolant tank of the radiator in the embodiment.
Figure 7:
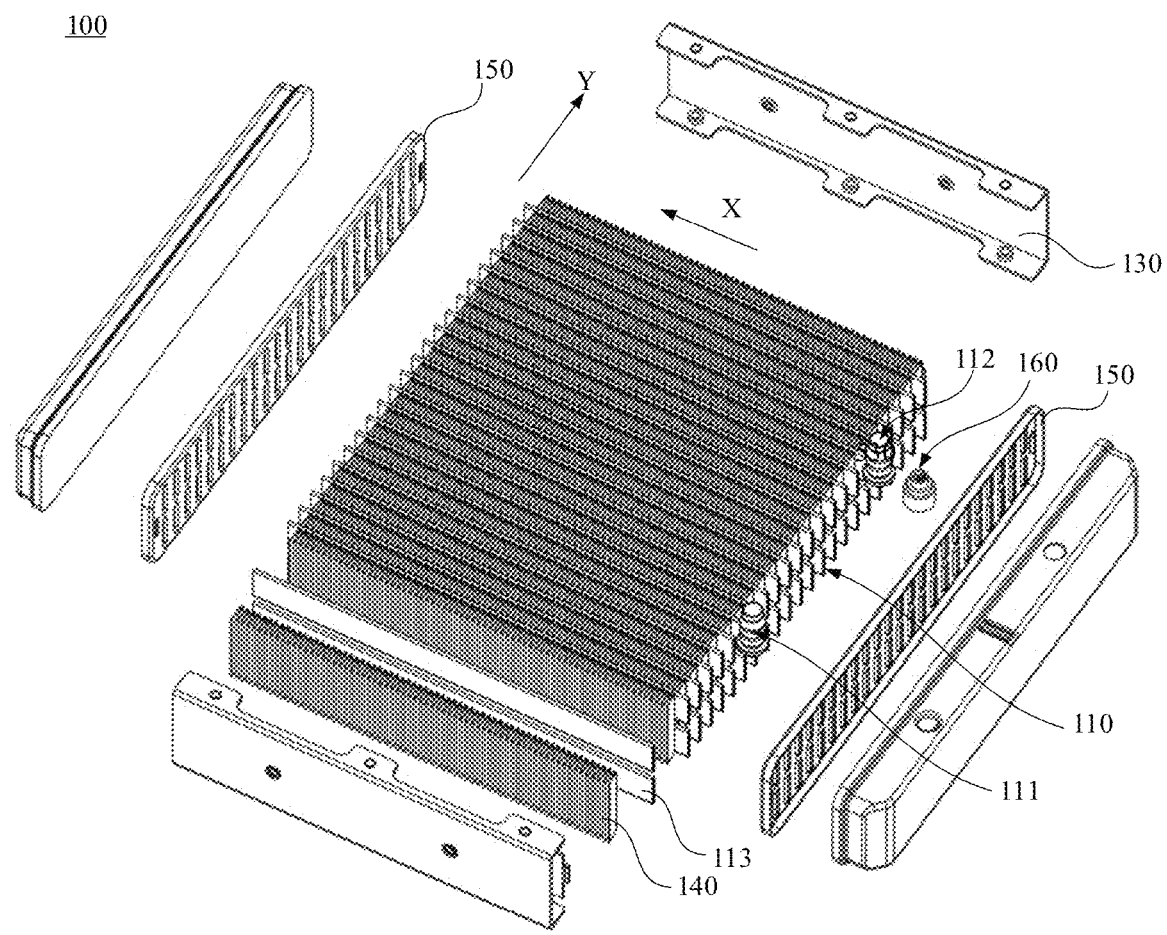
FIG. 7 is an exploded view of the coolant tank in FIG. 6.
Figure 8:
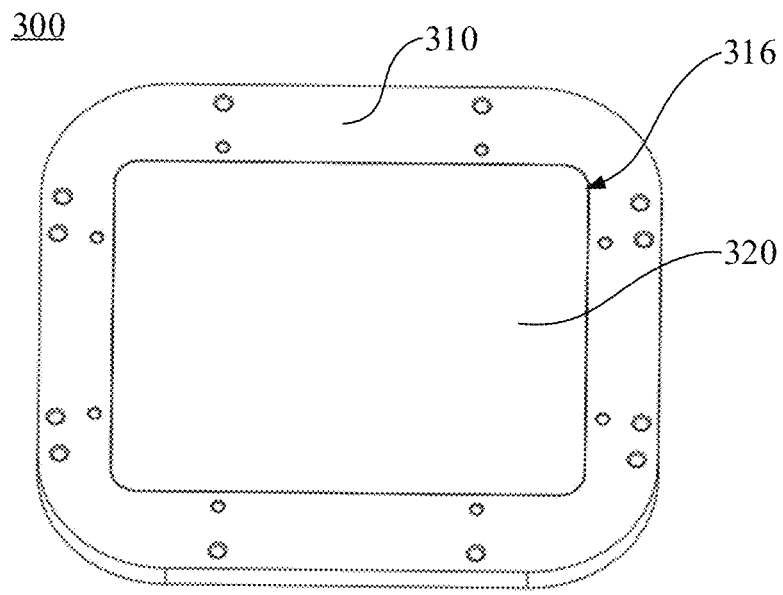
FIG. 8 is a schematic structural diagram of the heat-absorbing assembly of the radiator in the embodiment.

FIG. 6 is a schematic structural diagram of the coolant tank 100 of the radiator 10 in the embodiment. FIG. 7 is an exploded view of the coolant tank 100 in FIG. 6. The coolant tank 100 has a first direction X and a second direction Y that are perpendicular to each other. The heat exchange pipe 110 of the coolant tank 100 includes a plurality of flat tubes 113 connected end to end. The first end of the first flat tube 113 is the first liquid inlet 111, and the distal end of the last flat tube 113 is the first liquid outlet. 112. Adjacent flat tubes 113 are connected through a U-shaped joint (not shown).

The plurality of flat tubes 113 are spaced apart along the second direction Y. A first heat sink fin 140 is disposed between two adjacent flat tubes 113 in the second direction Y to increase the heat dissipation area of the heat exchange pipe 110. Optionally, the plurality of flat tubes 113 are arranged in two layers which are upper and lower layers, thereby increasing the number of flat tubes 113 in a given volume and increasing the heat dissipation length of the heat exchange pipe 110.

In some embodiments, the coolant tank 100 includes two insertion plates 150. The insertion plates 150 have insertion holes corresponding to the plurality of flat tubes 113. The two insertion plates 150 are spaced apart along the first direction X, and two ends of each of the plurality of flat tubes 113 are respectively inserted and fixed in corresponding insertion holes of the insertion plate 150.

It can be understood that in other examples, the heat exchange pipes 110 may also be arranged in other winding patterns, which will not be described herein.

Specifically, the coolant tank 100 also includes a tank case 130. The heat exchange pipe 110 is installed in the tank case 130. The tank case 130 is open in an upper and lower direction to facilitate heat exchange between the heat exchange pipe 110 and external air.

Specifically, the heat exchange pipeline 110 also has a liquid discharge and supply port, and a sealing cover 160 is installed on the liquid discharge and supply port. The heat exchange pipe 110 opens or closes the liquid discharge and supply port through the sealing cover 160 to drain the internal coolant or supply the internal coolant.

In this embodiment, the strength of the support frame 200 is greater than the strength of the tank case 130. The support frame 200 is used for installing the heat-absorbing assembly 300 and the driving pump 410. In addition, the radiator 10 is installed on the air guide tube 30 of the photographic light through the support frame 200. Moreover, the front case 41, the rear case 42 and the dust-proof mesh 45 of the photographic light are all installed on the support frame 200.

In order to improve the strength of the support frame 200, the support frame 200 may be made of a material with higher strength, or its thickness may be increased. For example, the tank case 130 and the support frame 200 are both made of aluminum alloy, the tank case 130 has a thickness of 1 mm, and the support frame 200 has a thickness of 2 mm.

In some embodiments, referring to FIGS. 3 and 4. The support frame 200 includes two support plates 210. The two support plates 210 are spaced apart on opposite sides of the coolant tank 100 along the first direction X. The support plates 210 include a mounting part 211 and supporting parts 212. The mounting part 211 is fixed to a side wall of the coolant tank 100. The number of supporting parts 212 is two or more. The two or more supporting parts 212 are connected to the bottom of the mounting part 211 at intervals so that the supporting parts 212 protrude from the coolant tank 100 and enclose the heat exchange space 201 together with the coolant tank 100. The spacing between adjacent supporting parts 212 is conducive to heat exchange at the sides of the heat exchange space 201.

Optionally, the mounting part 211 is welded and fixed to the side wall of the coolant tank 100.

Specifically, the support frame 200 also includes a first frame 220 extending along the first direction. The first frame 220 is disposed on a side of the coolant tank 100, and the first frame 220 and the support plates 210 are disposed on different sides of the coolant tank 100. Two ends of the first frame 220 are respectively connected to the supporting parts 212 of the two support plates 210. A side of the first frame 220 away from the heat exchange space 201 is used to install the heat-absorbing assembly 300, so that the heat-absorbing assembly 300 does not occupy the internal space of the heat exchange space 201. In addition, the heat-absorbing assembly 300 is arranged around the heat exchange space 201, so that the radiator 10 has a compact structure.

Optionally, each support plate 210 further includes a first bent part 213, which is fixed to the supporting part 212 close to the first frame 220 and extends along the first direction X. Two ends of the first frame 220 are respectively fixed to the two first bent parts 213 through fasteners.

Specifically, the support frame 200 also includes a second frame 230. The first frame 220 and the second frame 230 are spaced apart on opposite sides of the coolant tank 100 along the second direction Y. The second direction Y is perpendicular to the first direction X. Two ends of the second frame 230 are connected to the supporting parts 212 of the two support plates 210 respectively. A side of the second frame 230 away from the heat exchange space 201 is used to install the driving pump 410, so that the driving pump 410 does not occupy the internal space of the heat exchange space 201. In addition, the driving pump 410 is arranged around the heat exchange space 201, so that the radiator 10 has a compact structure.

The driving pump 410 is installed on the second frame 230, and the heat-absorbing assembly 300 is installed on the first frame 220. The first frame 220 and the second frame 230 are located on opposite sides of the coolant tank 100, that is, the driving pump 410 and the heat-absorbing assembly 300 are located on the opposite sides of the coolant tank 100. On the one hand, the pipe connecting the driving pump 410 and the heat-absorbing assembly 300 is extended and the cooling length of the pipe is increased. On the other hand, the driving pump 410 and the heat-absorbing assembly 300 are arranged oppositely so that the weight distribution is balanced.

Optionally, second bent parts 231 are provided at two ends of the second frame 230, and the second bent parts 231 are fixed to the adjacent supporting parts 212 through fasteners.

Specifically, the support frame 200 also includes an annular frame 240. The annular frame 240 is arranged around the bottom of the heat exchange space 201. The annular frame 240 is fixed to the bottom parts of the supporting parts 212 so that the supporting parts 212 of the two support plates 210 are integrated.

In addition, the annular frame 240 is also fixedly connected to the bottom part of the first frame 220 and the bottom part of the second frame 230 to improve the integrity and strength of the support frame 200.

Optionally, referring to FIG. 3, the annular frame 240 has connection holes 241 for connecting with the case of the photographic light. The annular frame 240 is configured to support the coolant tank 100 as well as be fixedly installed on the case for supporting the case.

Specifically, the support frame 200 further includes reinforcing bars 250, which are connected to all supporting parts 212 of the same support plate 210 in sequence. The reinforcing bars 250 allow all the supporting parts 212 of the same support plate 210 to be integrated, increasing the strength of the support plate 210.

Optionally, the number of reinforcing bars 250 is two, which corresponds to the number of support plates 210.

In this embodiment, referring to FIGS. 2 and 3. The annular frame 240 is configured for installing and fixing the dust-proof mesh 45. The support plate 210 is configured for installing and fixing the sides of the case of the photographic light. The first frame 220 is configured for installing and fixing the front case 41. The second frame 230 is configured for installing and fixing the rear case 42.

In some embodiments, referring to FIGS. 8 to 12, the heat-absorbing assembly 300 includes a mounting member 310 and a heat-absorbing plate 320.

The mounting member 310 has a second liquid inlet 311 and a second liquid outlet 312 arranged opposite to each other. A first groove 313, second grooves 314 and a third groove 315 are provided on a side surface of the mounting member 310. One end of the first groove 313 is communicated with the second liquid inlet 311, the other end of the first groove 313 extends toward the second liquid outlet 312 and is a closed end. The second grooves 314 are spaced apart from the first groove 313, the second grooves 314 extend in the direction from the second liquid inlet 311 to the second liquid outlet 312. An end of each second groove 314 close to the second liquid inlet 311 is a closed end, and an end of each second groove 314 close to the second liquid outlet 312 is communicated with the second liquid outlet 312 through the third groove 315.

The heat-absorbing plate 320 is hermetically installed on the mounting member 310 and covers the first groove 313, the second grooves 314 and the third groove 315. The heat-absorbing plate 320 is provided with a plurality of heat sink slits 323 spaced apart from the second liquid inlet 311 to the second liquid outlet 312 on the side facing the mounting member 310. The heat sink slits 323 each connects the first groove 313 and the second grooves 314. The heat sink slits 323, the first groove 313, the second grooves 314 and the third groove 315 form a heat dissipation channel.

Since the first groove 313 and the second grooves 314 extend along the direction from the second liquid inlet 311 to the second liquid outlet 312, the plurality of heat sink slits 323 spaced apart along the direction from the second liquid inlet 311 to the second liquid outlet 312, and each heat sink slit 323 connects the first groove 313 and the second grooves 314, so the first groove 313, the second grooves 314 and the plurality of heat sink slits 323 are in communication with each other. The coolant can flow through the second liquid inlet 311, the first groove 313, the heat sink slits 323, the second grooves 314, the third groove 315 and the second liquid outlet 312 in sequence, dissipating heat from where the coolant passes through. The coolant flows through the entire area enclosed by the first groove 313, the second grooves 314 and the third groove 315, so that the heat dissipation area is large, and the flowing coolant has high heat dissipation efficiency, which improves the heat dissipation capacity of the heat-absorbing assembly 300.

The heat source, such as the light source 20, contacts the surface of the heat-absorbing plate 320 away from the heat sink slits 323, and the heat is conducted away by the coolant flowing over a large area between the mounting member 310 and the heat-absorbing plate 320, thereby reducing the temperature. In some embodiments, the heat source is installed on the mounting member 310 and is attached to the surface of the heat-absorbing plate 320 facing away from the heat-dissipating slits 323, so that the contact between the heat source and the surface of the heat-absorbing plate 320 facing away from the heat-dissipating gap 323 is stable and the contact area is large, and the heat is conducted away.

Specifically, the number of the second grooves 314 of the mounting member 310 may be one, two, or more than three.

Figure 9:
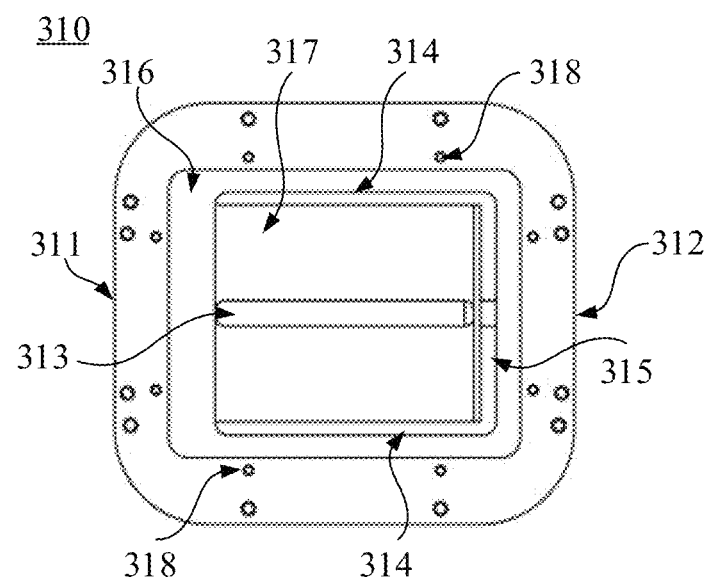
FIG. 9 is a schematic structural diagram of the mounting member of the heat-absorbing assembly in FIG. 8.
Figure 10:
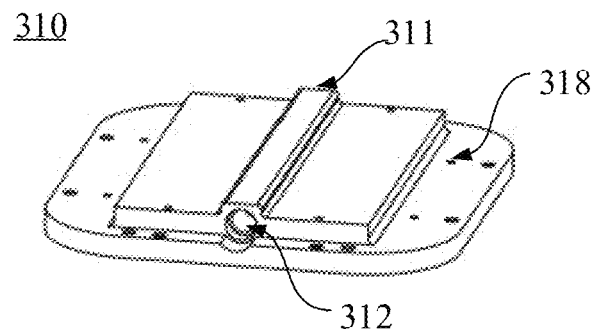
FIG. 10 is another perspective view of the mounting member in FIG. 9.

In some embodiments, referring to FIGS. 9 and 10, the number of the second grooves 314 is two, and the two second grooves 314 are respectively located on either side of the first groove 313. After the heat-absorbing plate 320 is installed on the mounting member 310, one end of the heat sink slits 323 is connected to one of the second grooves 314, the middle part of the heat sink slits 323 is connected to the first groove 313, and the other end of the heat sink slits 323 is connected to the other one of the second grooves 314.

Generally, the temperature is high in the middle part of the heat source and relatively low on both sides. When the heat-absorbing assembly 300 contacts a heat source, the coolant first flows through the first groove 313 in the middle. At this point, the temperature of the coolant is the lowest, which is conducive to rapid heat dissipation and cooling for the middle part of the heat source, and then the coolant flows into the second grooves 314, cooling two sides of the heat source.

Optionally, the first groove 313 is located in the middle of the mounting member 310, and the two second grooves 314 are symmetrically distributed with respect to the first groove 313.

The mounting member 310 is provided with a mounting groove 316. The first groove 313, the second grooves 314 and the third groove 315 are located at the bottom of the mounting groove 316. The heat-absorbing plate 320 is sealed and installed in the mounting groove 316. The surface of the heat-absorbing plate 320 facing away from the heat sink slits 323 is flush with the surface of the mounting member 310. The design of the mounting groove 316 is conducive to the positioning and installation of the heat-absorbing plate 320. In addition, the heat-absorbing plate 320 does not protrude from the surface of the mounting member 310, so that the heat source is able to fit the heat-absorbing plate 320 and the mounting member 310 at the same time. The mounting member 310 has a lower temperature, and the second liquid inlet 311 and the second liquid outlet 312 located at two ends of the mounting member 310 can assist in heat dissipation.

In some embodiments, mounting holes 318 are provided on the periphery of the mounting member 310. The heat source is fixedly mounted on the mounting member 310 through the mounting holes 318.

In some embodiments, the radius of the second liquid inlet 311 and the second liquid outlet 312 is 3 mm-5 mm, the width of the first groove 313 is 5 mm-10 mm, and the width of the second grooves 314 is 3 mm-6 mm. The width of the third groove 315 is 3 mm-6 mm.

In the present application, the heat-absorbing plate 320 may be a copper plate. The thickness of the heat-absorbing plate 320 is 1 mm-10 mm.

Figure 11:
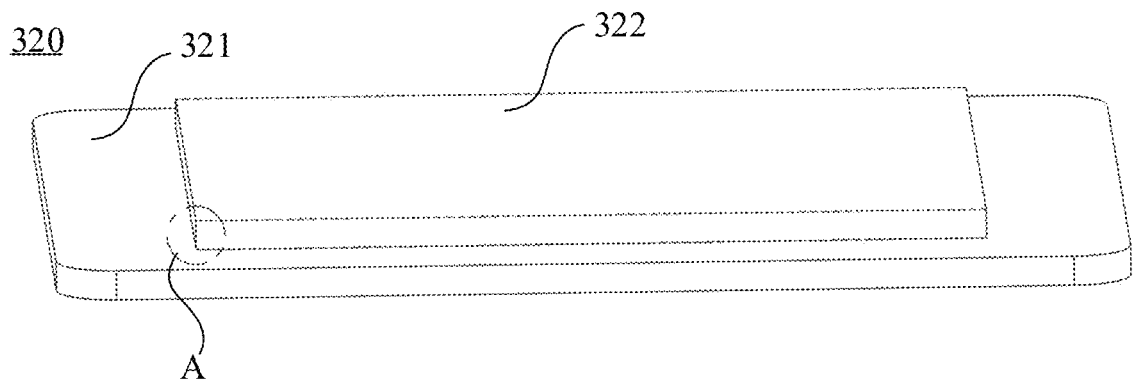
FIG. 11 is a schematic structural diagram of the heat-absorbing plate of the heat-absorbing assembly in FIG. 8.
Figure 12:
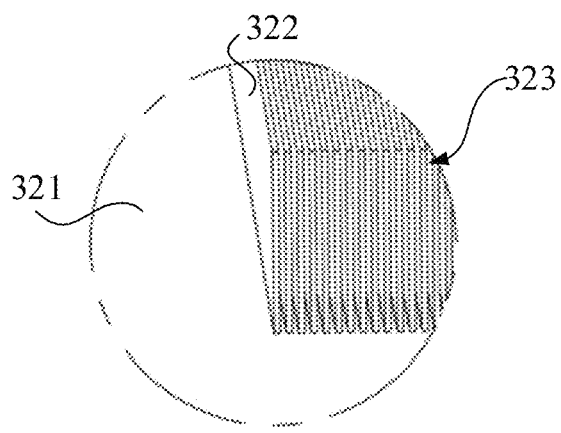
FIG. 12 is a partial enlarged view of area A in FIG. 11.

In some embodiments, referring to FIGS. 11 and 12, the roughness of the surface of the heat-absorbing plate 320 away from the heat sink slits 323 is less than or equal to 0.8 μm, so that the heat source can better fit on the surface of the heat-absorbing plate 320 for heat conduction, avoiding the decrease in heat dissipation efficiency caused by the existence of gaps.

In some embodiments, referring to FIGS. 11 and 12, the heat-absorbing plate 320 includes a plate body 321 and a plurality of second heat sink fins 322 protruding from the plate body 321. The plate body 321 is installed on the mounting member 310. The plurality of second heat sink fins 322 are spaced apart from each other in the direction from the second liquid inlet 311 to the second liquid outlet 312. The gap between two adjacent second heat sink fins 322 forms the heat sink slit 323. Through the second heat sink fins 322, heat sink slits 323 with smaller gaps can be formed, and the heat sink slits 323 are correspondingly more densely arranged, which helps the coolant to be distributed evenly and substantially cover the heat-absorbing plate 320, resulting in more uniform heat dissipation and higher heat dissipation efficiency.

Specifically, the second heat sink fins 322 are integrally formed on the plate body 321. For example, the second heat sink fins 322 are formed on the plate body 321 through a skiving process.

The thickness of the second heat sink fins 322 is 0.05 mm-0.15 mm. The thickness of the second heat sink fins 322 is small, which reduces the area occupied by the plate body 321, correspondingly increases the area of the heat sink slits 323 and facilitates heat exchange of the coolant between adjacent heat sink slits 323, thereby resulting in more uniform heat dissipation. The gap between two adjacent second heat sink fins 322 is 0.05 mm-0.15 mm, that is, the width of the heat sink slits 323 is 0.05 mm-0.15 mm, so that the coolant slowly passes through the heat sink slits 323, allowing sufficient time for the heat exchange. The length of the second heat sink fins 322 is 60 mm-70 mm, and the distance across the first second heat sink fin 322 and the last second heat sink fin 322 is 70 mm-90 mm.

Referring to FIG. 9, FIG. 11 and FIG. 12. The mounting member 310 is provided with a positioning recess 317. The first groove 313, the second grooves 314 and the third groove 315 are located at the bottom of the positioning recess 317. The plurality of second heat sink fins 322 abut against the wall of the positioning recess 317.

In some embodiments, referring to FIGS. 3 and 4, the radiator 10 further includes a driving box 420 installed on the support frame 200. The driving box 420 is electrically connected to the driving pump 410 to control the driving pump 410 to initiate and stop.

Specifically, the driving box 420 and the driving pump 410 are located on the same side of the heat exchange space 201 to facilitate wiring. The driving box 420 is installed on the second frame 230.

Specifically, the driving box 420 and the heat-absorbing assembly 300 are located on opposite sides of the heat exchange space 201, so that the driving box 420 and the light source 20 are arranged opposite to each other, so as to balance weight distribution.

In some embodiments, referring to FIGS. 3 and 4, the first liquid inlet 111, the first liquid outlet 112, the second liquid inlet 311, the second liquid outlet 312 and the driving pump 410 are communicated through pipe fittings according to the flow direction of the coolant. The pipe fittings extend along the surface of the support frame 200 and do not cross the heat exchange space 201 or occupy the internal space of the heat exchange space 201, nor do they protrude outward and occupy additional space, thus the entire radiator 10 is more compact.

Specifically, the pipe fittings include a first pipe fitting 510, a second pipe fitting 520 and a third pipe fitting 530. Two ends of the first pipe fitting 510 are connected to the first liquid outlet 112 and the second liquid inlet 311 respectively. Two ends of the second pipe fitting 520 are connected to the second liquid outlet 312 and the inlet of the driving pump 410 respectively. Two ends of the third pipe fitting 530 are connected to the outlet of the driving pump 410 and the first liquid inlet 111 respectively.

The above are only preferred embodiments of the present application and are not intended to limit the present application. Any modifications, equivalent substitutions and improvements made within the spirit and principles of the present application shall be included within the scope of protection of the present application.

What is claimed is:

1. A radiator, comprising:
    a coolant tank, the coolant tank having a heat exchange pipe for a coolant to circulate, and the heat exchange pipe having a first liquid inlet and a first liquid outlet;
    a support frame installed on the coolant tank, one end of the support frame being higher than the coolant tank, the support frame being arranged around the coolant tank, the support frame and the coolant tank enclosing a heat exchange space for exchanging heat with the heat exchange pipe;
    a heat-absorbing assembly located outside the heat exchange space, the heat-absorbing assembly having a heat dissipation channel, and the heat dissipation channel having a second liquid inlet connected to the first liquid outlet and a second liquid outlet connected to the first liquid inlet; and
    a driving pump installed on the support frame and located outside the heat exchange space, the driving pump being configured to drive the coolant to circulate along the heat exchange pipe, the first liquid outlet, the second liquid inlet, the heat dissipation channel, the second liquid outlet and the first liquid inlet in sequence.

2. The radiator according to claim 1, wherein the radiator further comprises a fan, and the fan is installed in the heat exchange space; and
    the radiator further comprises an air guide, and the air guide is disposed on a side of the coolant tank away from the fan.

3. The radiator according to claim 1, wherein the support frame comprises two support plates, the two support plates are spaced apart along a first direction on opposite sides of the coolant tank, and each support plate comprises a mounting part and supporting parts, the mounting part is fixed to a side wall of the coolant tank, the number of the supporting parts is two or more, and the two or more supporting parts are connected to a bottom part of the mounting part at intervals.

4. The radiator according to claim 3, wherein the support frame further comprises a first frame extending along the first direction, the first frame is located on one side of the coolant tank, and two ends of the first frame are respectively connected to the supporting parts of the two support plates, and a side of the first frame away from the heat exchange space is configured to install the heat-absorbing assembly.

5. The radiator according to claim 4, wherein the support frame further comprises a second frame, and the first frame and the second frame are spaced apart along a second direction on opposite sides of the coolant tank, the second direction is perpendicular to the first direction, two ends of the second frame are respectively connected to the supporting parts of the two support plates, and a side of the second frame away from the heat exchange space is configured to install the driving pump.

6. The radiator according to claim 3, wherein the support frame further comprises an annular frame, the annular frame is arranged around a bottom part of the heat exchange space, and the annular frame is fixed to a bottom part of the supporting parts; and
    the annular frame has a connection hole for connecting with a case of a photographic light.

7. The radiator according to claim 3, wherein the support frame further comprises reinforcing bars, and the reinforcing bars are respectively connected to all the supporting parts of the same support plate.

8. The radiator according to claim 1, wherein the heat-absorbing assembly comprises:
    a mounting member having the second liquid inlet and the second liquid outlet disposed opposite to each other, wherein a first groove, a second groove and a third groove are provided on a side surface of the mounting member, one end of the first groove is connected to the second liquid inlet, another end of the first groove extends in a direction toward the second liquid outlet and is a closed end, the second groove is spaced apart from the first groove, the second groove extends in a direction from the second liquid inlet to the second liquid outlet, and an end of the second groove close to the second liquid inlet is a closed end, and another end of the second groove close to the second liquid outlet is communicated with the second liquid outlet through the third groove; and
    a heat-absorbing plate, wherein the heat-absorbing plate is hermetically installed on the mounting member and covers the first groove, the second groove and the third groove, and one side of the heat-absorbing plate facing the mounting member is provided with a plurality of heat sink slits spaced apart along the direction from the second liquid inlet to the second liquid outlet, the plurality of heat sink slits communicate with the first groove and the second groove, and the plurality of heat sink slits, the first groove, the second groove and the third groove together form the heat dissipation channel.

9. The radiator according to claim 1, wherein the radiator further comprises a driving box installed on the support frame, and the driving box is electrically connected to the driving pump to control the driving pump to initiate and stop; and the driving box and the driving pump are located on the same side of the heat exchange space, and the driving box and the heat-absorbing assembly are located on opposite sides of the heat exchange space.

10. The radiator according to claim 2, wherein the radiator further comprises a driving box installed on the support frame, and the driving box is electrically connected to the driving pump to control the driving pump to initiate and stop; and the driving box and the driving pump are located on the same side of the heat exchange space, and the driving box and the heat-absorbing assembly are located on opposite sides of the heat exchange space.

11. The radiator according to claim 3, wherein the radiator further comprises a driving box installed on the support frame, and the driving box is electrically connected to the driving pump to control the driving pump to initiate and stop; and the driving box and the driving pump are located on the same side of the heat exchange space, and the driving box and the heat-absorbing assembly are located on opposite sides of the heat exchange space.

12. A photographic light, comprising a light source and a radiator, wherein the radiator comprises:

a coolant tank, the coolant tank having a heat exchange pipe for a coolant to circulate, and the heat exchange pipe having a first liquid inlet and a first liquid outlet;

a support frame installed on the coolant tank, one end of the support frame being higher than the coolant tank, the support frame being arranged around the coolant tank, the support frame and the coolant tank enclosing a heat exchange space for exchanging heat with the heat exchange pipe;

a heat-absorbing assembly located outside the heat exchange space, the heat-absorbing assembly having a heat dissipation channel, and the heat dissipation channel having a second liquid inlet connected to the first liquid outlet and a second liquid outlet connected to the first liquid inlet; and a driving pump installed on the support frame and located outside the heat exchange space, the driving pump being configured to drive the coolant to circulate along the heat exchange pipe, the first liquid outlet, the second liquid inlet, the heat dissipation channel, the second liquid outlet and the first liquid inlet in sequence;

wherein the light source is installed on the support frame or the heat-absorbing assembly, and the light source is in contact with the heat-absorbing assembly.

13. The photographic light according to claim 12, wherein the radiator further comprises a fan, and the fan is installed in the heat exchange space; and the radiator further comprises an air guide, and the air guide is disposed on a side of the coolant tank away from the fan.

14. The photographic light according to claim 12, wherein the support frame comprises two support plates, the two support plates are spaced apart along a first direction on opposite sides of the coolant tank, and each support plate comprises a mounting part and supporting parts, the mounting part is fixed to a side wall of the coolant tank, the number of the supporting parts is two or more, and the two or more supporting parts are connected to a bottom part of the mounting part at intervals.

15. The photographic light according to claim 14, wherein the support frame further comprises a first frame extending along the first direction, the first frame is located on one side of the coolant tank, and two ends of the first frame are respectively connected to the supporting parts of the two support plates, and a side of the first frame away from the heat exchange space is configured to install the heat-absorbing assembly.

16. The photographic light according to claim 15, wherein the support frame further comprises a second frame, and the first frame and the second frame are spaced apart along a second direction on opposite sides of the coolant tank, the second direction is perpendicular to the first direction, two ends of the second frame are respectively connected to the supporting parts of the two support plates, and a side of the second frame away from the heat exchange space is configured to install the driving pump.

17. The photographic light according to claim 14, wherein the support frame further comprises an annular frame, the annular frame is arranged around a bottom part of the heat exchange space, and the annular frame is fixed to a bottom part of the supporting parts; and the annular frame has a connection hole for connecting with a case of a photographic light.

18. The photographic light according to claim 14, wherein the support frame further comprises reinforcing bars, and the reinforcing bars are respectively connected to all the supporting parts of the same support plate.

19. The photographic light according to claim 12, wherein the heat-absorbing assembly comprises:

a mounting member having the second liquid inlet and the second liquid outlet disposed opposite to each other, wherein a first groove, a second groove and a third groove are provided on a side surface of the mounting member, one end of the first groove is connected to the second liquid inlet, another end of the first groove extends in a direction toward the second liquid outlet and is a closed end, the second groove is spaced apart from the first groove, the second groove extends in a direction from the second liquid inlet to the second liquid outlet, and an end of the second groove close to the second liquid inlet is a closed end, and another end of the second groove close to the second liquid outlet is communicated with the second liquid outlet through the third groove; and a heat-absorbing plate, wherein the heat-absorbing plate is hermetically installed on the mounting member and covers the first groove, the second groove and the third groove, and one side of the heat-absorbing plate facing the mounting member is provided with a plurality of heat sink slits spaced apart along the direction from the second liquid inlet to the second liquid outlet, the plurality of heat sink slits communicate with the first groove and the second groove, and the plurality of heat sink slits, the first groove, the second groove and the third groove together form the heat dissipation channel.

20. The photographic light according to claim 12, wherein the radiator further comprises a driving box installed on the support frame, and the driving box is electrically connected to the driving pump to control the driving pump to initiate and stop; and the driving box and the driving pump are located on the same side of the heat exchange space, and the driving box and the heat-absorbing assembly are located on opposite sides of the heat exchange space.

\* \* \* \* \*